United States Patent [19]

Jackson

[11] Patent Number: 5,067,130
[45] Date of Patent: Nov. 19, 1991

[54] METHOD FOR ACQUIRING DATA IN A LOGIC ANALYZER

[75] Inventor: Ronald M. Jackson, Portland, Oreg.
[73] Assignee: Tektronix, Inc., Beaverton, Oreg.
[21] Appl. No.: 414,337
[22] Filed: Sep. 29, 1989
[51] Int. Cl.$^5$ .......................................... G06F 11/00
[52] U.S. Cl. .................... 371/22.1; 371/15.1; 371/29.1
[58] Field of Search ............ 371/22.1, 15.1, 25.1, 371/29.1

[56] References Cited

U.S. PATENT DOCUMENTS

| | | | |
|---|---|---|---|
| 4,480,317 | 10/1984 | Haag et al. | 364/900 |
| 4,513,395 | 4/1985 | Henry et al. | 364/900 |
| 4,654,848 | 3/1987 | Noguchi | 371/20 |
| 4,731,768 | 3/1988 | Easterday | 368/118 |
| 4,835,736 | 5/1989 | Easterday | 364/900 |
| 4,965,800 | 10/1990 | Farnbach | 371/22.1 |

OTHER PUBLICATIONS

Phillips Data Test Equipment, Phillips Test and Measuring Instruments, Inc., Including Models PM3540, PM3543, PM3551A, PM8810, PM8811.

*Primary Examiner*—Jerry Smith
*Assistant Examiner*—Russell Cass
*Attorney, Agent, or Firm*—Boulden G. Griffith

[57] ABSTRACT

A logic analyzer stores the activity around the last in a series of triggering events while also storing the activity around several other triggering events immediately preceding the last trigger. The acquisition memory is first positioned into a number, N, of memory sections and the trigger condition of interest is defined. Then repeated acquistions are performed using this same trigger condition. At first, data from each of these acquisitions is stored in each one of the number of memory sections. When all of the memory sections have been filled once, if the trigger condition is still occurring, the acquisition memories are reused in the same order in which they were originally used as many times as necessary until it is ascertained that the trigger condition is no longer occurring or some external conditon has changed, at which time the logic analyzer is stopped. One of the memory sections then contains the data that occurred in the vicinity of the last trigger. Another of the memory sections contains data reflecting the activity that immediately preceded the stopping of the logic analyzer. The remaining N−2 memory sections contain data that occurred in the vicinity of the triggers that immediately preceded the last trigger. Timestamping the acquired data allows the timing relationships involved to be reconstructed.

16 Claims, 2 Drawing Sheets

| A | B | C | D | E | F |
|---|---|---|---|---|---|
| 4th TO LAST TRIG. | 3rd TO LAST TRIG. | 2nd TO LAST TRIG. | LAST TRIG. | DATA IMMEDIATELY PRECEDING STOP | 5th TO LAST TRIG. |

METHOD FOR ACQUIRING DATA IN A LOGIC ANALYZER

BACKGROUND OF THE INVENTION

This invention relates to the field of data acquisition, and more particularly to the field of data acquisition in a logic analyzer with an acquisition memory that is partitioned into a number of acquisition memory sections.

Logic analyzers are digital data acquisition instruments that allow a user to acquire and analyze digital data from a large number of logic signals, such as the address, data, and control lines of a microprocessor. The logic analyzer periodically compares each of these logic signals to a reference threshold in order to determine which logic state, high or low, each of the lines is in.

Trigger sections, or trigger machines, allow the user to specify when in time he or she would like to acquire data, i.e., which data they are interested in. Even the largest memories for data storage are quickly filled by all of the data occurring in a fast electronic system, so the process of deciding which data to store is very important. The data from a system under test is typically sent to a circular memory. This memory can be repeatedly overwritten and refilled many times with useless information before the interval of interest is reached.

When the triggering conditions have been satisfied, the flow of new data into the circular memory is interrupted and the data already in the memory is saved. This can occur immediately upon the occurrence of the trigger condition, and the contents of the memory will then reflect entirely the activity that occurred prior to the trigger event, i.e., will be "pretrigger" data. Conversely, if the memory is allowed to keep filling for its whole length after the trigger condition occurs, the contents of the memory will reflect entirely the activity that occurred immediately after the trigger event, i.e., will be "posttrigger" data. Typically, any one of a number of combinations of pretrigger and posttrigger data can be selected by a choice of trigger position. Which combination a user chooses will be dictated by the problem they are trying to solve and which conditions in the temporal vicinity of the problem can be identified well enough to program the trigger machine.

U.S. Pat. No. 4,654,848 to Kazuo Noguchi for a "Multi-Trigger Logic Analyzer" discloses a logic analyzer capable of generating multiple triggers to perform multiple data acquisitions. To accommodate the data from these multiple acquisitions, the acquisition memory of this logic analyzer is partitioned into a number of smaller data acquisition memory sections. The trigger machine of this logic analyzer is capable of changing word recognizer values during operation so that each of the multiple triggers that it produces can be in response to a different data pattern. This allows each portion of memory to be used for distinct and non-repetitive acquisitions.

Partitioned acquisition memory can also be used to make multiple data acquisitions using the same trigger criteria. For example, one might wish to repeatedly acquire the data in the vicinity of a particular recurring event to look for differences that appear in that data. However, for some types of problems, a view of the activity surrounding the first N trigger events does not help to solve the operator's problem. For certain classes of problems, the user of a logic analyzer would prefer to be able to examine data surrounding the last N trigger events before that trigger event ceases to occur for some unknown reason.

For example, a computer obtaining successive blocks of data from a disk drive crashes intermittently in a way that suggests that something in the data may provide a clue to the crashes. So, the operator would like to be able to examine the data and other activity in the vicinity of the last several data block requests. A trigger condition can be defined that will cause a trigger to occur each time a data block request occurs. Then, when the operator notices that the system under test is no longer producing the triggering event, he would like to be able to view the activity that occurred in the vicinity of the last occurrence of that trigger event, and the several immediately preceding it, to try to figure out what is causing the crashes.

Some logic analyzers have a reference memory, or multiple reference memories, as well as an acquisition memory, thus permitting one set of acquired data to be saved while another set is acquired. Using a logic analyzer with a single reference memory, one can make repeated acquisitions and copy the contents of the acquisition memory to the reference memory between each one of them. This gives a view of the data in the vicinity of the last occurrence of the trigger event, but no information about the data in the vicinity of the second to last or third to last triggers. If the logic analyzer has multiple reference memories, it can store the data associated with more than one trigger, but, because it takes considerable time to transfer the data between memories, there will always be gaps in time during which any number of additional triggers may have occurred without the associated data being captured.

What is desired is a method that will permit a logic analyzer to store the activity around the last in a series of triggering events while also storing the activity around several other triggering events immediately preceding the last trigger.

SUMMARY OF THE INVENTION

The present invention is a method that permits a logic analyzer to store the activity around the last in a series of triggering events while also storing the activity around several other triggering events immediately preceding the last trigger. The acquisition memory is first partitioned into a number, N, of memory sections and the trigger condition of interest is defined. Then repeated acquisitions are performed using this same trigger condition. At first, data from each of these acquisitions is stored in each one of the number of memory sections. When all of the memory sections have been filled once, if the trigger condition is still occurring, the acquisition memories are reused in the same order in which they were originally used as many times as necessary until it is ascertained that the trigger condition is no longer occurring or some external condition has changed, at which time the logic analyzer is stopped. One of the memory sections then contains the data that occurred in the vicinity of the last trigger. Another of the memory sections contains data reflecting the activity that immediately preceded the stopping of the logic analyzer. The remaining N−2 memory sections contain data that occurred in the vicinity of the triggers that immediately preceded the last trigger.

DETAILED DESCRIPTION

Figure 1:
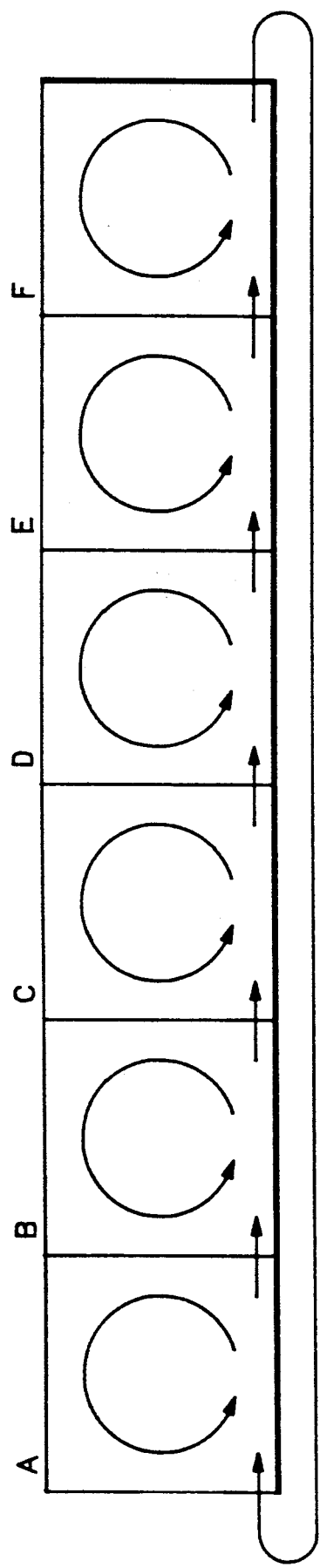
FIG. 1 is a conceptual diagram of memory space utilization according to the method of the invention.

Referring to FIG. 1, the present invention utilizes the acquisition memory space of a logic analyzer as a circular arrangement of a number of circular memories. In this example, the overall memory space has been partitioned into six memory sections, A, B, C, D, E, and F. When the trigger condition has been defined and the logic analyzer has been started, the stream of acquired data is first applied to memory section A. If this memory section it completely filled before the first trigger occurs, the memory address controller (not shown) goes from the last address in section A to the first address in section A and the new data is written over the old data, destroying it.

When the first trigger of this acquisition occurs, the memory address controller switches to the first address in section B, leaving the data that immediately preceded the trigger in section A. Alternatively, this operation can be delayed for a number of acquisition cycles until part or all of the data in section A has been replaced with new data one more time. This delay time is selected by operator selection of trigger position. If the operator wants to see what happened after the trigger, rather than before it, maximum delay is used and all of the contents of section A are rewritten once before the data flow is switched to section B.

In either event, once the data in the vicinity of the first trigger has been left in section A and the current data is being applied to section B, the same waiting and over-writing process is continued in memory section B while the logic analyzer is waiting for the second trigger. After the second trigger occurs and any post-trigger data is stored in memory section B, the memory address controller directs the flow of data into section C, where the same process is repeated.

The method of this invention is useful for those cases where the number of times that the trigger condition is expected to occur is greater than the number of memory sections available and yet is finite. If the specified trigger condition keeps occurring forever, then stopping the logic analyzer at some arbitrary time will result in acquiring data in the vicinity of a number of sequential trigger occurrences immediately preceding the stopping of the logic analyzer. If the specified trigger condition only occurs a number of times that is less than the number of acquisition memory sections available, data in the vicinity of all of them will be stored without resort to the technique of the present invention.

If the number of times that the specified trigger condition occurs is larger than the number of memory sections available, when the last memory section, F, is filled with the data associated with the sixth occurrence of the specified trigger condition, the memory address controller directs the flow of incoming data back to the first address in section A, over-writing the data stored there in connection with the first occurrence of the trigger condition. And, when the seventh trigger condition occurs and any post-trigger data has been written into section A, the data flow is directed to section B again, overwriting the data in that section. This process, of cycling through the circular memories in a circular fashion, may be repeated indefinitely.

The infinite trip through the circle of circular memories continues until the logic analyzer is stopped. This could occur either because an operator intervenes to manually stop the logic analyzer or because the logic analyzer has been programmed to stop upon the receipt of an external signal or because a timer has detected the non-occurrence of any triggers for some selected period of time. An operator might notice that the system under test has gone into a mode that he knows will prevent any further occurrences of the trigger condition, or he might have some other way of ascertaining, perhaps from the front panel of the logic analyzer, that triggers have ceased to occur. Or, an operator might configure the logic analyzer to stop upon the occurrence of an external signal, perhaps from another logic analyzer, indicating that some event of interest has occurred in the system under test. In this case, the operator may not be interested in the last trigger, but rather a series of triggers leading up to the change indicated by the external signal.

Figure 2:
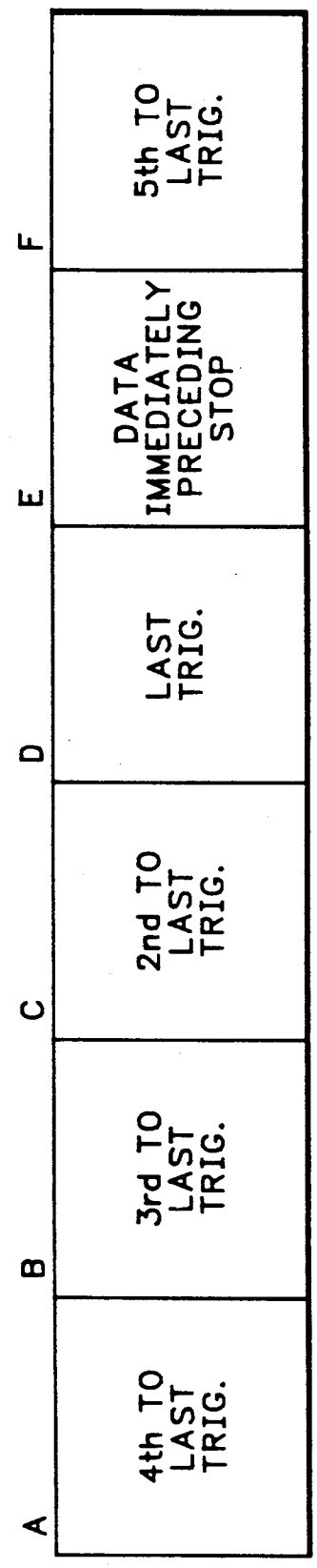
FIG. 2 is an illustration of how the resulting data is arranged in the acquisition memory after a data acquisition according to the method of the invention.

Referring now to FIG. 2, if the trigger condition has stopped occurring and the logic analyzer has been stopped, either manually or as a result of detecting for itself that there are no more triggers occurring, the resulting data will be arranged in the partitioned memory in the form shown in this figure. In this particular example, there were ten triggers (or some multiple of six, plus four triggers) before they ceased to occur. Section E contains the data immediately preceding the stop command. Section D contains the data that occurred in the vicinity of the last trigger. Sections C, B, A, and F will contain data associated in time with each of the four occurrences of the trigger condition that occurred immediately preceding the last trigger. Moreover, since all of the acquired data was timestamped, exact timing relationships between all the these triggers and the associated data can be reconstructed.

Figure 3:
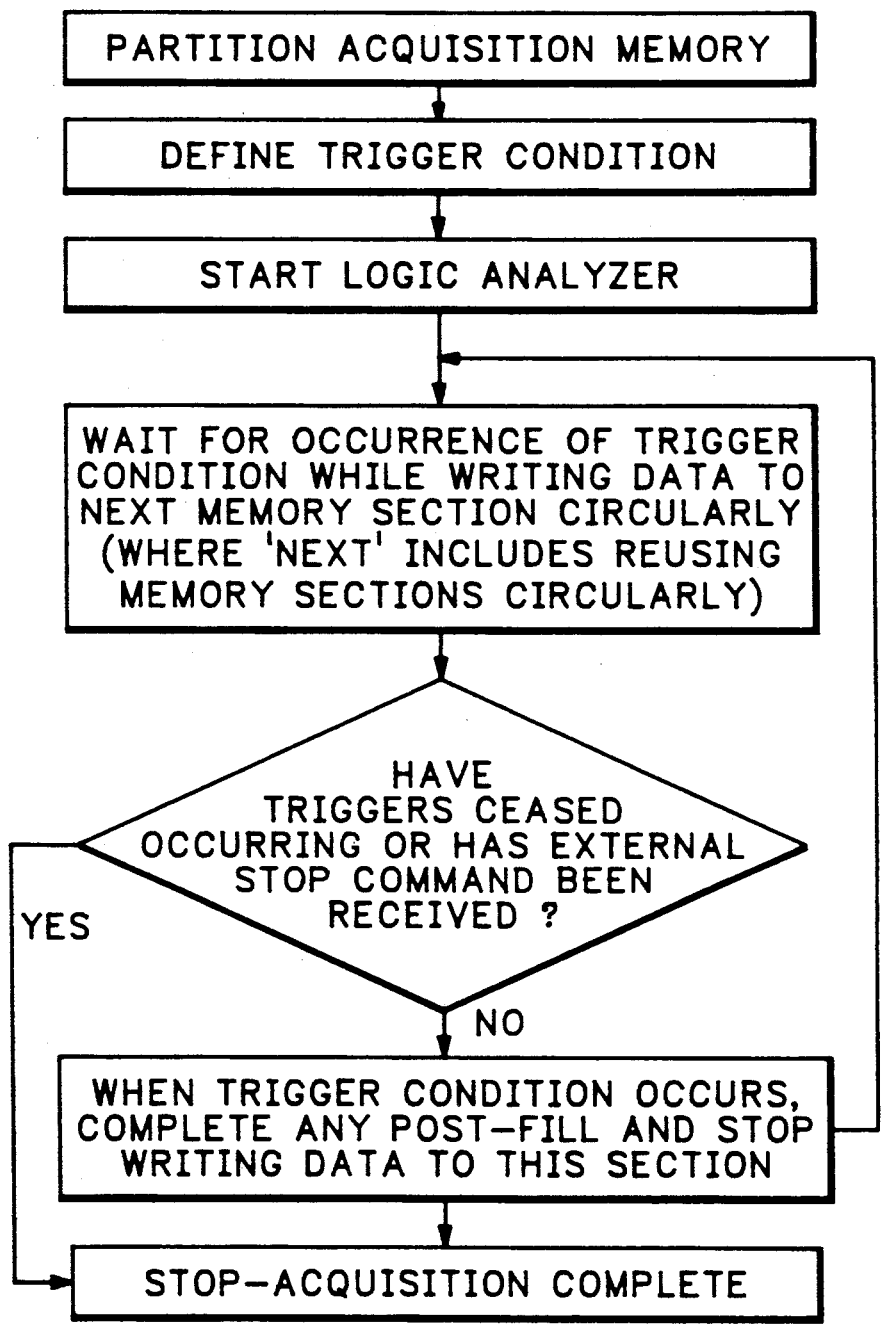
FIG. 3 is a logic flow diagram of the method of the invention.

FIG. 3 is a logic flow diagram of method of the invention. It provides an overview of the sequence of steps. First, the memory of the logic analyzer is partitioned into a number memory sections. Next, the user defines a trigger condition. Then the user starts the logic analyzer. The logic analyzer writes data to the first memory section in a circular fashion until the trigger condition occurs. Assume for now that the trigger condition does occur a number of times. When the trigger condition occurs, any post-filling selected by the user is completed and then the logic analyzer stops writing data to this section and starts writing data to the next section. The filling of additional memory sections continues with each occurrence of the trigger condition until they have all been used once, after which they are reused in a circular fashion. When it is determined, either by the user or by automatic monitoring of the period between triggers by the logic analyzer, that the trigger condition has ceased to occur, or that some external event of interest has occurred, the logic analyzer is stopped.

The software for managing the display of data acquired according to the present method must keep track of several things, including: which memory section was being written to when the acquisition was stopped, the boundary location between the oldest data and the youngest data in each memory section, whether all memory sections were used once and if they were not, which ones were not ever used, and whether or not the memory section containing the data acquired just before the logic analyzer was stopped had had a chance to be completely filled at least once around. The latter information is necessary to tell whether the oldest data is just after the newest/oldest data boundary or at the first location in this memory section. Also, if a requirement that each partition be completely filled before going on to the next one is not in effect, then it is necessary to keep track of whether each memory section was filled to the point of circling around or not. If it was, the location immediately following the youngest location is the oldest one. If it was not, the oldest data is at the first location in the section.

If a first trigger occurs and a first memory section is post-filling with data after this trigger, and then a second trigger condition occurs, the second trigger condition is ignored. The data which caused the second trigger is stored normally, if it otherwise would be, i.e., if it is not qualified out by data qualification. Data qualification is a well known technique of only storing data that meets certain criteria.

If a memory section is pre-filling, but the operator selected amount of pre-filling has not yet occurred when the trigger condition occurs, the trigger condition is recognized and the missing pre-fill is compensated for by additional post-fill, so that the whole memory section is fully utilized.

It is also desirable, if appropriate facilities are available in the logic analyzer, to store timestamp information for the last location filled in each memory section, with the timestamp referenced to the beginning of the overall acquisition. This permits all of the data from each of the sections to be displayed in one timing diagram with the proper time relationships all made available through the usual means, such as delta time between cursors.

It is also useful to store the time at which the trigger occurred within each memory section, so that a trigger location in each section may be displayed for the user. The values of any counters or timers as they were at the end of each memory section are also saved. If they have not completed their count 30ns before the next partition is reached, the counters are stopped and the values they contain are moved to a storage register along with the status of a bit indicating that their counts were never completed. This allows the counter/timer to be readied for looking for the next trigger. The values in the storage register are then moved to RAM and associated with the other information regarding that trigger and partial acquisition. All of this information may be useful in assisting the user in understanding the changes in the system under test's behavior that led to the non-reoccurrence of the trigger condition.

While a preferred embodiment of the present invention has been shown and described, it will be apparent to those skilled in the art that many changes and modifications may be made without departing from the invention in its broader aspects. The claims that follow are therefore intended to cover all such changes and modifications as fall within the true spirit and scope of the invention.

I claim:

1. A method for acquiring data in a logic analyzer having a plurality of memory sections, the method comprising the steps of:
   automatically storing data in one of the plurality of memory sections upon in occurrence of a trigger condition;
   repeating the automatically storing step upon the further occurrence of the trigger condition until all of the memory sections have been used;
   continuing to repeat the automatically storing step after all of the memory sections have been used once by reusing the memory sections to store new data;
   automatically ascertaining that the trigger condition is no longer occurring; and
   automatically stopping the logic analyzer to complete the data acquisition in response to the ascertaining step.

2. A method as recited in claim 1 further comprising the preliminary step of:
   defining a trigger condition.

3. A method as recited in claim 1 wherein the storing step comprises the steps of:
   writing current data to the memory section in a circular fashion while waiting for a trigger condition to occur;
   ceasing to write current data to the memory section upon the occurrence of the trigger condition.

4. A method as recited in claim 3 wherein the ceasing step comprises the additional step of:
   waiting for a delay interval between the occurrence of the trigger condition and the ceasing.

5. A method as recited in claim 4 wherein the ceasing step further comprises the step of:
   noting the location of the trigger condition within the memory section.

6. A method as recited in claim 3 wherein the storing step comprises the additional step of:
   timestamping one of the locations in the memory section with an indication of the time since the beginning of the overall acquisition.

7. A method as recited in claim 6 further comprising, after the stopping step, the steps of:
   reconstructing the time relationships between all of the trigger events and data; and
   displaying the acquired data in a timing diagram display.

8. A method as recited in claim 1 wherein the stopping step comprises the steps of:
   counting the time between successive occurrences of the trigger condition; and
   issuing the stop command when the counted time exceeds a pre-selected value.

9. A method as recited in claim 1 wherein the stopping step comprises the steps of:
   monitoring an external input; and
   causing the logic analyzer to stop when the external input is received.

10. A method as recited in claim 1 further comprising, after the stopping step, the step of:
    displaying the acquired data.

11. A method for acquiring data in a logic analyzer having a plurality of memory sections, the method comprising the steps of:
    defining a trigger condition;
    starting the logic analyzer and a timestamp clock;

automatically storing data and the time on the timestamp clock in one of the plurality of memory sections upon an occurrence of the trigger condition;
repeating the automatically storing step upon the further occurrence of the trigger condition until all of the memory sections have been used;
continuing to repeat the automatically storing step after all of the memory sections have been used once by reusing the memory sections to store new data;
automatically ascertaining that the trigger condition is no longer occurring; and
automatically stopping the logic analyzer to complete the data acquisition in response to the ascertaining step.

12. A method for acquiring data according to claim 1 wherein the storing step comprises the steps of:
writing current data to the memory section in a circular fashion while waiting for a trigger condition to occur;
ceasing to write current data to the memory sections upon the occurrence of the trigger condition.

13. A method for acquiring data according to claim 12 wherein the ceasing step comprises the steps of:
waiting for a delay interval between the occurrence of the trigger condition and the ceasing; and
noting the location of the trigger condition within the memory section.

14. A method for acquiring data according to claim 11 wherein the stopping step comprises the steps of:
counting the time between successive occurrences of the trigger condition; and
issuing a stop command when the counted time exceeds a pre-selected value.

15. A method for acquiring data according to claim 11 wherein the stopping step comprises the steps of:
monitoring an external input; and
causing the logic analyzer to stop when the external input is received.

16. A method for acquiring data according to claim 11 further comprising the steps of:
reconstructing the time relationship between all of the trigger events and data; and
displaying the acquired data in a timing diagram display.

* * * * *